United States Patent
Groenhagen (10) Patent No.: US 10,185,055 B2
(45) Date of Patent: Jan. 22, 2019

(54) METHOD AND WIND ENERGY INSTALLATION FOR LIGHTNING WARNING

(71) Applicant: Wobben Properties GmbH, Aurich (DE)

(72) Inventor: Jannes Groenhagen, Südbrookmerland (DE)

(73) Assignee: Wobben Properties GmbH, Aurich (DE)

(*) Notice: Subject to any disclaimer, the term of this patent is extended or adjusted under 35 U.S.C. 154(b) by 142 days.

(21) Appl. No.: 15/036,397

(22) PCT Filed: Nov. 19, 2014

(86) PCT No.: PCT/EP2014/075007
§ 371 (c)(1),
(2) Date: May 12, 2016

(87) PCT Pub. No.: WO2015/075067
PCT Pub. Date: May 28, 2015

(65) Prior Publication Data
US 2016/0291204 A1    Oct. 6, 2016

(30) Foreign Application Priority Data

Nov. 19, 2013  (DE) .................. 10 2013 223 592

(51) Int. Cl.
*G01W 1/10*   (2006.01)
*G01W 1/16*   (2006.01)
(Continued)

(52) U.S. Cl.
CPC ........... *G01W 1/10* (2013.01); *G01R 29/0842* (2013.01); *G01R 29/14* (2013.01); *G01W 1/16* (2013.01)

(58) Field of Classification Search
CPC ..... G01R 29/0842; G01R 29/14; G01W 1/16; G01W 1/10
See application file for complete search history.

(56) References Cited

U.S. PATENT DOCUMENTS 5,140,523 A    8/1992   Frankel et al.
2003/0067731 A1  4/2003   Kent
(Continued)

FOREIGN PATENT DOCUMENTS

AT         389012 B       10/1989
DE    102004000025 A1      3/2006
(Continued)

OTHER PUBLICATIONS

Brieselang.Net, "Preventive Lightning Protection," retrieved from http://brieselang.net/vorbeugender-blitzschutz on Apr. 12, 2016, 2 pages (with Machine English Translation).

*Primary Examiner* — Bryan Bui
(74) *Attorney, Agent, or Firm* — Seed Intellectual Property Law Group LLP (57) ABSTRACT

A method for lightning warning with a large number of wind energy installations, in particular with a part of a wind farm, wherein the wind energy installations are each located at one location, and each of the large number of wind energy installations comprises a sensor arrangement for registering an environmental parameter, comprising at least an anemometer, a temperature sensor and/or a humidity sensor, wherein the sensor arrangement comprises a further sensor, in particular an electric field meter for registering electric fields, and the method comprises the following steps, namely a registration of at least one value for the environmental parameter, comprising at least an electric field, with the aid of the sensors of the sensor arrangement with the large number of wind energy installations; and an evaluation of the at least one value for the environmental parameter for (Continued)

the prediction of the lightning warning for the locations of the large number of wind energy installations. A wind energy installation and/or a wind farm with a large number of wind energy installations and/or a network of wind energy installations and/or a network of wind farms for lightning warning, and the use of this to form a system for weather prediction, in particular for thunderstorm and/or lightning warning.

9 Claims, 9 Drawing Sheets

(51) Int. Cl.
  *G01R 29/14* (2006.01)
  *G01R 29/08* (2006.01)

(56) References Cited

U.S. PATENT DOCUMENTS

| | | |
|---|---|---|
| 2004/0183686 A1 | 9/2004 | Jones et al. |
| 2007/0156339 A1 | 7/2007 | Oettinger |
| 2010/0134946 A1 | 6/2010 | Narasimalu et al. |
| 2012/0162845 A1 | 6/2012 | Sanchez |
| 2014/0167732 A1 | 6/2014 | Mueller et al. |
| 2015/0052992 A1* | 2/2015 | Pabst .............. G01W 1/16 73/170.24 |

FOREIGN PATENT DOCUMENTS

| | | |
|---|---|---|
| DE | 102011122807 B3 | 4/2013 |
| DE | 102012222973 A1 | 6/2014 |
| EP | 1944627 A2 | 7/2008 |
| EP | 2190092 A2 | 5/2010 |
| JP | H06503421 A | 4/1994 |
| JP | H07151866 A | 6/1995 |
| JP | 2000065953 A | 3/2000 |
| JP | 2013506792 A | 2/2013 |
| JP | 2013054006 A | 3/2013 |
| SU | 1525648 A2 | 11/1989 |
| WO | 9210804 A1 | 6/1992 |
| WO | 2011042576 A1 | 4/2011 |
| WO | 2013097946 A2 | 7/2013 |

* cited by examiner

METHOD AND WIND ENERGY INSTALLATION FOR LIGHTNING WARNING

BACKGROUND

Technical Field

The invention relates to a method for lightning warning with a large number of wind energy installations, in particular with a part of a wind farm, and a wind energy installation and a wind farm, as well as a network of wind energy installations and/or wind farm installations for lightning warning, and a use of a system for weather prediction, in particular for thunderstorm and/or lightning warning.

Description of the Related Art

Wind energy and wind power are responsible for an ever-growing proportion of global electricity generation, and are therefore becoming of significant value. With the rising number of wind energy installations and wind farm installations, however, the amount of servicing work and the time required for servicing the wind energy installations and wind farms are also increasing at the same time. A large amount of servicing work is, however, associated with high costs and a high level of logistical planning for the servicing work and the servicing personnel. An important point to be taken into account when planning the servicing work is to avoid unnecessary down-times during which servicing work is interrupted by stormy conditions, in particular during thunderstorms with lightning strikes on wind energy installations. The probability of a lightning strike is particularly high in the case of wind energy installations, since, due to their construction, they often constitute the highest point in the surroundings, and are thereby a preferred point for atmospheric discharges.

Public weather predictions are typically used for lightning and/or thunderstorm warning; locally, and in particular in relation to a particular location of a wind energy installation, these are very imprecise and may not enable lightning prediction at all.

The prediction of a lightning strike in a wind energy installation, in particular during the course of servicing work, must however be very reliable, since in the event of an actual lightning strike there is a high risk to safety, and even a risk to the life of the servicing personnel. On the other hand, servicing work should however only be interrupted when there genuinely is a sufficient probability of a lightning strike, so that servicing work is not interrupted unnecessarily.

It would therefore be desirable to provide a method and apparatus with which it is possible to predict a lightning strike at an early stage or to detect it, in particular a lightning strike in a particular wind energy installation, and to issue a corresponding warning announcement so that the servicing personnel can interrupt the servicing work and/or the wind energy installation can be switched off. When the risk of the lightning strike has then receded, the servicing work can be resumed and/or the wind energy installation can be switched back on. In particular it would be desirable for the potential place and time of a lightning strike to be predicted in a precise and reliable manner.

For the prediction of the weather, and in particular for the prediction of thunderstorms, the derivation or prediction of a state of the atmosphere for the future from a past and a present weather condition of the atmosphere, using known physical rules, is known. What are known as non-linear equations are used here, in which even small changes in the initial conditions lead to a large variation in the results, in this case the weather forecast. This phenomenon is also known as the butterfly effect.

The initial conditions or data, in particular the measured data or measured values for the environment and/or atmospheric conditions that provide information about the present state of the atmosphere, are registered using a network of ground measuring stations. The measuring stations here typically register the wind speed, temperature, air pressure and humidity, as well as the quantity of precipitation. A reliable weather prediction is only possible when a sufficiently large number of measuring stations that collect weather data are present.

The measuring stations known from the prior art are, however, often arranged close to the ground, so that the measured (weather) data measured, in particular the environmental parameters, are falsified by ground effects, for example by heat or cold stored in the ground. Incorrect measured data however does not permit a reliable prediction of the weather for a specific place. In addition, data relating to electric or electromagnetic fields is also not collected by the known ground measuring stations, so that a lightning prediction is practically impossible.

The German Patent and Trade Mark Office has researched the following documents on this topic: DE 10 2012 222 973 A1, AT 389 012 B and brieselang.net (an internet site relating to preventive lightning protection).

BRIEF SUMMARY

Embodiments are directed to a system, apparatus, and method for weather prediction, in particular for thunderstorm and/or lightning warning, which is/are improved over the prior art. One embodiment is to provide a method and an apparatus for lightning warning with a large number of wind energy installations.

Embodiments are directed to a method for lightning warning with a large number of wind energy installations, in particular with a part of a wind farm and a wind energy installation and/or a wind farm and/or a network of wind energy installations and/or a network of wind farm installations and a use of a wind energy installation and/or of a wind farm installation and/or of a network of wind energy installations and/or of a network of wind farm installations to form of a system for weather prediction.

The invention comprises the idea of a method for lightning warning with a large number of wind energy installations, in particular with a part of a wind farm, wherein the large number of wind energy installations are each located at one location, and each of the large number of wind energy installations comprises a sensor arrangement for detecting an environmental parameter, comprising at least an anemometer, a temperature sensor and/or a humidity sensor, wherein the sensor arrangement comprises a further sensor, in particular an electric field meter for detecting electric fields, and the method comprises the following steps, namely a detection of at least one value for the environmental parameter, comprising at least an electric field, with the aid of the sensors of the sensor arrangement with the large number of wind energy installations; and an evaluation of the at least one value for the environmental parameter for the prediction of the lightning warning for the locations of the large number of wind energy installations.

The invention moreover includes the idea of a wind energy installation and/or a wind farm with a large number of wind energy installations and/or a network of wind energy installations and/or a network of wind farms for lightning warning, wherein the wind energy installation and the large number of wind energy installations are each at one location, and each of the wind energy installations comprises a sensor arrangement for detecting an environmental parameter, comprising at least an anemometer, a temperature sensor and/or a humidity sensor, and the sensor arrangement comprises a further sensor, in particular an electric field meter for detecting an electric field; and a lightning warning equipment is designed with an evaluation unit for evaluating the at least one value for the environmental parameter, at least comprising an electric field, and for predicting the lightning warning for the locations of the wind energy installations.

In addition, the invention comprises a use of a wind energy installation and/or of a wind farm and/or of a network of wind energy installations and/or of a network of wind farms to form a system for weather prediction, in particular for thunderstorm and/or lightning warning, wherein the system is configured to carry out the method according to the invention.

The concept of the invention is described below by way of example—without thereby restricting the invention. The invention proposes the use of wind energy installations, in particular multiple wind energy installations of a wind farm, as weather measuring stations for weather prediction, in particular for the prediction of thunderstorms and/or lightning warning. This thus involves the use of a number i of wind energy installations as weather measuring stations, where i can adopt an integral value of i=1, 2, . . . , n. Wind energy installations as weather measuring stations have the advantage that they already comprise multiple different sensors, such as for example anemometers, thermometers, barometers and/or humidity sensors. In addition, the sensors of wind energy installations are arranged at a considerable height of up to 200 meters, so that the measured data is not affected or falsified by ground effects. In Germany alone, furthermore, there are a large number of now more than 23,000 individual wind energy installations, which come into question as potential weather measuring stations for the method according to the invention, so that environmental parameters can be detected with a dense network of measuring stations.

It is furthermore provided according to the concept of the invention, that wind energy installations are fitted with an additional sensor for detecting electric fields, and in particular also magnetic and/or electromagnetic fields. The detection of the electric fields, in particular of the electric field strength of an electric field, in the atmosphere in the surroundings of the wind energy installation, can be used for a precise prediction of lightning and lightning strikes. The invention here takes into account the idea that during a thunderstorm in the atmosphere, in particular in the storm clouds, a separation of charge occurs which locally (in horizontal and vertical directions) leads to electrical field strengths of different magnitudes and/or to large electric potential gradients. These electric fields/field strengths and/or the distribution of the electric field strengths can be measured with the help of the sensor arrangement of the individual wind energy installations, in particular the additional sensor for detecting electric fields. If the electric field strength for example exceeds a (pre-)specified critical value for a lightning strike, then a lightning warning is issued. In particular, by means of detecting and evaluating multiple environmental parameters, such as for example air pressure, temperature and electric field strength, a probability for a lightning strike in a particular wind energy installation can be determined.

In addition, the concept of the invention provides for the networking of wind energy installations and/or wind farm installations and/or networks of wind energy installations and/or wind farm installations, so providing a system for weather prediction, in particular for warning of thunderstorms and/or lightning.

These and other preferred embodiments of the invention provide more precise detail both of the method and of the arrangement for lightning warning. In particular, preferred developments are objects of the dependent claims and indicate in detail advantageous options for how the method explained above, or the apparatus for lightning warning in the context of the object as well as in respect of further advantages, is to be implemented or designed.

One preferred embodiment provides that the large number of wind energy installations are connected with a server, in particular with a server of a wind farm, and the method further comprises the following steps: A transmission of the at least one value for the environmental parameter from the large number of wind energy installations to the server; a preparation of a map with the at least one value for the environmental parameter and the locations of the large number of wind energy installations; and an evaluation of the map for the prediction of lightning warning for the locations of the large number of wind energy installations. The individual wind energy installations are here connected with a server, in particular with a server of the wind farm, via connecting lines, so that the environmental parameters detected with the sensor arrangement of the respective wind energy installation can be passed on to the server. Together with the detected values for the environmental parameter or parameters, information about the particular location of the detecting wind energy installation is transmitted to the server, so that the server, in particular an appropriately designed processor element, is able to prepare a map from the detected environmental parameters and the locations of the wind energy installations, on which the values for the environmental parameter, in particular their strength, are displayed in relation to their location. The map that has been prepared can then be evaluated to predict a lightning strike, in particular for the prediction of a lightning strike at a particular location of a particular wind energy installation. Standard models, such as are known from the prior art weather research and weather prediction, can be for example used for the evaluation of the detected environmental parameter or of the map that has been prepared.

In one expedient embodiment it can be provided that the at least one and/or the multiple values for the environmental parameter are selected from the following group of values: wind strength, wind direction, temperature, air humidity, air pressure, electric field strength, magnetic field strength and/or electromagnetic field strength. In this form of embodiment it is provided that the present environmental parameters of the atmosphere, in particular of the surroundings of the detecting wind energy installation, are detected. From the detected value(s) for the environmental parameter, a present state for a present weather situation, in particular a present weather state of the atmosphere, can then be determined, from which then, using known physical rules for weather prediction, a state of the atmosphere for the future, in particular for a lightning strike or lightning warning, can be derived or predicted. It is, for example, also provided here that the environmental parameters are detected over a longer period of time, and are compared repeatedly with the predictions, in particular with the predicted environmental parameters, and corrected if relevant. From the development of the environmental parameters over time, that is the history of the environmental parameters detected, it is then possible to determine a prediction for the future development of the detected environmental parameter.

One preferred development provides that the at least one value for the environmental parameter is compared with a reference value. In this form of embodiment it is provided that the detected environmental parameters are compared with reference values. Empirical values from weather research, in particular empirical values for the occurrence of a lightning strike, can, for example, be used as reference values. It is possible, for example, in the presence of a particular air pressure, a particular air humidity and a particular field strength of the electric field, to draw a conclusion as to a stormy situation, in particular as to a possible lightning strike. A critical value for the electric field strength for the high probability of occurrence of a lightning strike at standard pressure ($p=101.325$ Pa$=101.325$ N/m$^2$) and standard temperature (T=0° C.) is a field strength of about 3,000 kV/m. Depending on other environmental parameters such as wind strength, temperature, air humidity and/or air pressure, the occurrence of a lightning strike can however also occur even at smaller field strengths in the range of between 300 and 400 kV/m. A further factor or trigger for a lightning strike is the presence of highly energetic electrons from cosmic radiation, which can trigger a lightning strike even at field strengths of between 150 and 300 kV/m. A possible reference value for the electric field strength is thus 150 kV/m, at which there is a significant risk of a lightning strike.

In one advantageous embodiment it can be provided that a minimum value, a maximum value and/or a gradient are determined when evaluating the map. This form of embodiment makes it possible to determine the extrema of the present weather situation in the wind farm installation in a simple manner. For example, lightning will tend to strike the wind energy installation at which the electromagnetic field is strongest. The air humidity can, however, also play a role. Both environmental parameters, in particular their maximum and minimum values, are then taken into account in the evaluation and the prediction. With the determination of minimum and/or maximum values, it is also relatively simple to detect extreme storm conditions, for example strong gusts of wind or wind fronts. In particular, changes in the weather over time can, through registering changes in the minimum and maximum values of the environmental parameters over time, be effectively detected. It is also possible to determine a gradient as a measure for the direction of the steepest rise or change of an environmental parameter.

A preferred development provides that with each sensor arrangement of the large number of wind energy installations, multiple values for the environmental parameter are registered, and multiple maps are prepared and evaluated with the multiple values for the environmental parameters. It is particularly provided here that not just one environmental parameter value, for example the wind strength, but multiple environmental parameters, for example wind strength, wind direction, temperature, air humidity, air pressure and field strength of an electric, magnetic and/or electromagnetic field are required. In particular, the combination of wind direction and field strength permits a good prediction of the direction and speed with which a field strength distribution will develop.

A further development can provide that multiple maps are combined with one another. In particular the combination of different values for the environmental parameters permits an improved prediction for a particular storm condition, in particular for a prediction of thunderstorms or lightning.

In particular it is provided that each of the large number of wind energy installations of the wind farm comprises a sensor arrangement for registering a large number of environmental parameters, and that the respective sensor arrangement comprises a sensor for wind strength, a sensor for wind direction, a sensor for temperature, a sensor for air humidity, a sensor for air pressure and a sensor for electric field strength. In particular the sensor for electric field strength can comprise a sensor for magnetic field strength and/or electromagnetic field strength. The sensor results can be recorded on one or more maps for the area of the large number of wind energy installations.

Due to the wind energy installations distributed over the area, a reliable prediction of lightning strikes, or at least a reliable warning of lightning strikes can be made for this area through evaluation of the prepared map or maps. The number of environmental parameters measured over the whole of the area advantageously makes it possible to give information about states and tendencies for the area through evaluation of the prepared map or maps.

In particular a library database for a wind energy installation can be prepared covering the whole area, which gives the respective environmental parameters individually for each wind energy installation on the area that are relevant when a lightning strike must be expected at the individual wind energy installation on the area. A large number of wind energy installations of the wind farm to which the individual wind energy installation belongs advantageously serve as an information base. In particular the library database can be reconfigurable, and a parameter transmission of environmental parameters to a control room can be made. In this way it is in particular advantageously possible to make an individual preparation of a characteristic curve of the environmental parameters relevant for the wind energy installation, stating in which range of environmental parameters a lightning warning is to be issued for this wind energy installation, in particular a lightning strike can be predicted. This results in a high level of reliability of a lightning warning and/or lightning prediction for this individual wind energy installation, and thus to a particularly reliable protection of service personnel proportionate to the expense of interrupting the service activity. This leads to a particularly advantageous use of a wind energy installation as a station for lightning warning and/or lightning prediction; in particular for the formation of a particularly preferred system for lightning warning and/or lightning prediction with a number of wind energy installations of a wind farm. Preferably the wind energy installation can be used as a weather station and/or the wind farm as a system for weather prediction.

One embodiment preferably provides that, based on the evaluation of the maps for the locations of the large number of wind energy installations, probabilities for a lightning strike, in particular for a lightning strike at a particular wind energy installation, are assigned. It is particularly provided here that the presently registered environmental parameters, in particular wind strength, wind direction, temperature, air humidity, air pressure and the field strength of an electric, magnetic and/or electromagnetic field at a particular wind energy installation or for a specific location of the wind energy installation are to be evaluated and assessed such that a probability for a lightning strike is determined and assigned to the wind energy installation or the location of the wind energy installation. It is also possible to take into account the development over time of the registered environmental parameters for this purpose. For example, the probability for a lightning strike increases when the field strength of an electric, magnetic and/or electromagnetic field rises sharply over a short period of time. For the determination of the probabilities it is possible, for example, to make use of a standard model and/or empirical values from weather research/weather prediction.

One preferred form of embodiment relates to a method in which the probabilities determined for a lightning strike are compared with limiting probabilities, and a lightning warning is issued for a location of the large number of wind energy installations at which the probability for a lightning strike exceeds the limiting probability. In particular, a lightning warning for the corresponding location of the wind energy installation or the multiple locations is issued when the probability of a lightning strike is greater than 50%, preferably greater than 70%, and even more preferably greater than 90%.

One advantageous form of embodiment relates to a method in which the lightning warning is issued in the form of a warning message, in particular for the specific wind energy installation of the large number of wind energy installations, where the warning message can be issued as an audible announcement and/or in the form of a warning light. It is provided here—in the case of a lightning warning—that this is issued in the form of an automatic warning message, for example over loudspeakers in the interior of the tower, so that the servicing personnel are warned and can interrupt possible servicing work. It can also be provided that a warning lamp is automatically switched on, which then warns of a possible lightning strike. It can also be provided that in the event of a lightning warning, the corresponding wind energy installation is automatically switched off.

A meteorological model used in the context of a particularly preferred development of the method provides that not only an electric field, but also other environmental parameters such as the wind strength, wind direction, temperature and air humidity mentioned above are used in order to permit a lightning warning, in particular a lightning prediction. The meteorological model for the use of an electric field meter for detecting electric field strengths is based in the simplest case on the following physical mechanism of the formation of a lightning strike. The physical mechanism provides in the simplest case, although not limited to that, for the coming together of flows of warm, moist masses of air from which water vapor condenses out as they rise, forming a towering cumulus cloud under certain external conditions. The higher such a cumulus cloud is, the greater is the probability that charges develop inside it through friction and the atomization of water droplets. This is particularly the case when ice crystals become positively charged in the upper, colder part of the cumulus cloud and droplets become negatively charged in the lower part of the cumulus cloud. A predominantly positive charge of this sort in the upper part of a cumulus cloud can allow electric fields to develop between it and a predominantly negative charge in the lower part of the cumulus cloud, depending on the height of the cumulus cloud (up to a few kilometers), which electric fields lead to voltages of several hundred million volts.

A discharge of this charge separation, initially within the cloud, can lead to what is known as a leader in the direction of the ground which, perhaps with the formation of an upward streamer at the ground or at exposed points on the ground, for example a wind energy installation, results in the formation of an ionized lightning channel in which then the main discharge—the lightning strike itself—follows. Even on the basis of this comparatively simple physical mechanism, the development has recognized that a meteorological method providing a basis for lightning warning, in particular lightning prediction, is all the more reliable the more supporting points are present for detecting electric fields. The development therefore advantageously provides for an increasing number of wind energy installations of a wind farm, at least however of part of a wind farm with a selection of wind energy installations (for example the wind energy installations provided at the edges of the wind farm and a distribution of wind energy installations within the area of the wind farm), in order to enable supporting points for the measurement of electric fields. Advantageously these can be all the wind energy installations of a wind farm. Advantageously the measurement of the above-mentioned environmental parameters is performed at all of the wind energy installations, in any case however at the wind energy installations constituting the above-mentioned supporting points.

A concrete example of a method for lightning warning with a number i of wind energy installations, in particular with a part of a wind farm, will now be described below—without restricting the invention to the concrete values. The number i of wind energy installations, where i can adopt a value of 1, 2, . . . n, are here stationed at different locations, where each of the wind energy installations comprises a sensor arrangement for detecting an environmental parameter with at least an anemometer, a temperature sensor and/or a humidity sensor and a further sensor, in particular an electric field meter, for detecting electric field strengths. With the help of the sensors, at least one value for an environmental parameter, for example wind strength, wind direction, temperature, air humidity, air pressure and/or the field strength of an electric field is detected, at least however the electric field strength. The detected values for the environmental parameter are then evaluated for the prediction of a lightning strike and lightning warning for the respective locations of the wind energy installations. The fact that charge separation can occur in the storm clouds during a thunderstorm, then resulting locally in electric field strengths of different magnitudes, is taken into account here. The electric field strength and/or the distribution of the electric field strengths can be detected with the help of the sensor arrangement of the number i of wind energy installations. If the electric field strength at a particular wind energy installation exceeds a (pre-)specified critical value, a limit value for an electric field, then a lightning warning is issued for this wind energy installation. The critical field strength that leads to a lightning discharge in air at standard pressure ($p=101.325$ Pa$=101.325$ N/m$^2$) and standard temperature ($T=0°$ C.) is about 3000 kV/m. Depending on other environmental parameters such as wind strength, temperature, air humidity and/or air pressure, the occurrence of a lightning strike can however also occur even at smaller field strengths in the range of between 300 and 400 kV/m. A further factor or trigger for a lightning strike is the presence of highly energetic electrons from cosmic radiation, which can trigger a lightning strike even at field strengths of between 150 and 300 kV/m. If, under standard conditions ($p=101.325$ Pa, $T=0°$ C.), the electric field strength at one or more wind energy installations exceeds, for example, a limit value of 150 kV/m, a lightning warning for the one or the multiple wind energy installation(s) is issued.

Exemplary embodiments of the invention are described below with reference to the figures in comparison to the prior art, which is also illustrated in part. These are not necessarily intended to represent the exemplary embodiments to scale, but rather the figures are drawn in a schematic and/or somewhat distorted form where this helps the explanation. Reference is made to the relevant prior art in respect of supplements to the teachings immediately discernible from the figures. It is to be borne in mind here that a wide variety of modifications and changes relating to the form and detail of an embodiment can be made without deviating from the general idea of the invention. The features of the invention disclosed in the description, in the figures and in the claims can be significant both individually as well as in any combination for the further development of the invention. In addition, all combinations of at least two of the features disclosed in the description, the figures and/or the claims fall within the framework of the invention. The general idea of the invention is neither restricted to the exact form or the detail of the preferred embodiments illustrated and described below, nor restricted to an object that would be restricted in comparison to the object claimed in the claims. In respect of the ranges of dimensions given, it is intended that values lying within the stated limits are also disclosed as limit values, and may be used and claimed in any desired manner. Identical or similar parts, or parts with an identical or similar function are, wherever useful, given an identical reference sign for the sake of simplicity.

BRIEF DESCRIPTION OF THE SEVERAL VIEWS OF THE DRAWINGS

Further advantages, features and details of the invention emerge from the following description of preferred exemplary embodiments and with reference to the figures.

In detail.

DETAILED DESCRIPTION

Figure 1:
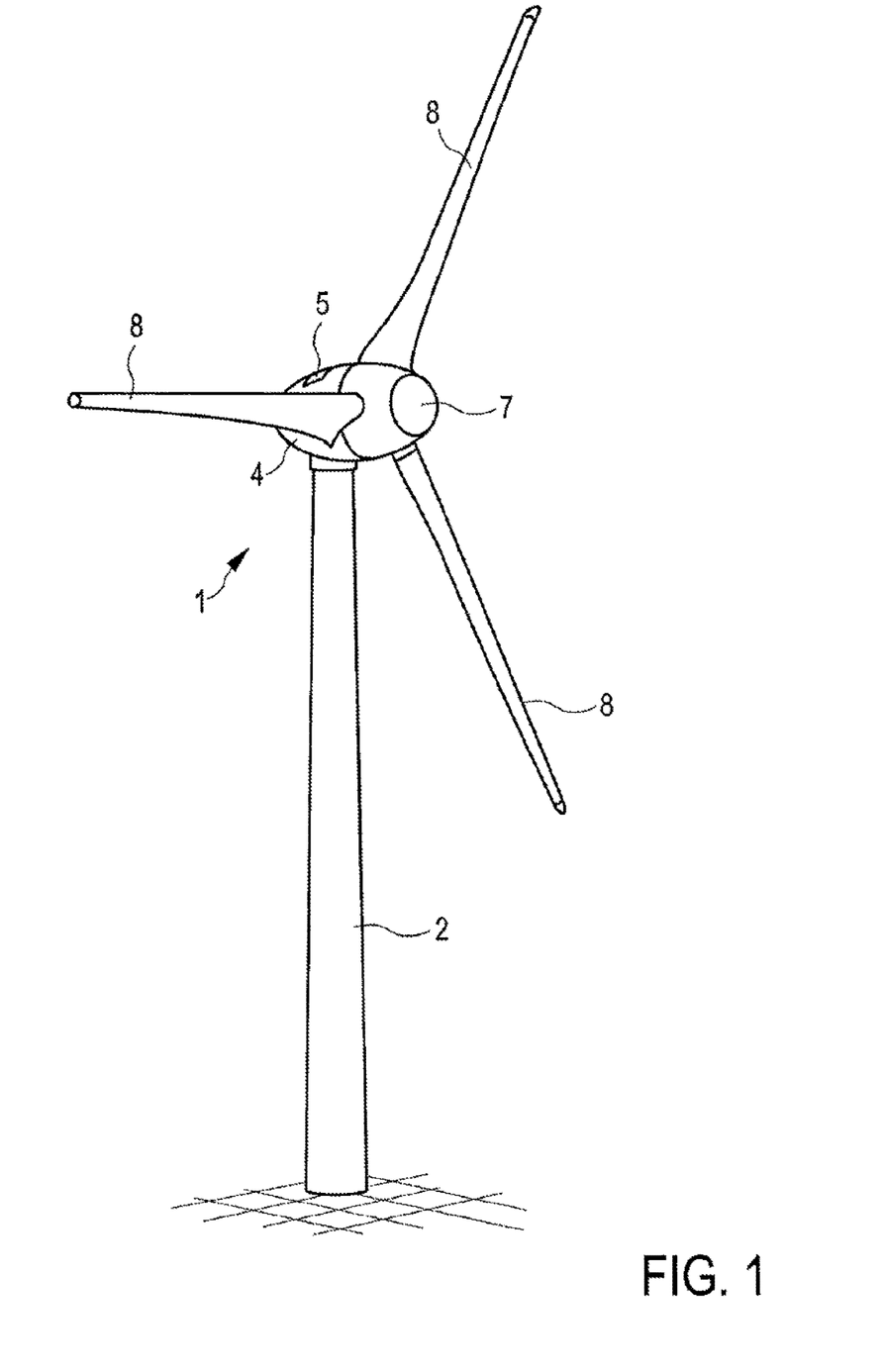
FIG. 1 shows a possible form of embodiment of a wind energy installation.

FIG. 1 shows a wind energy installation 1 with a tower 2 and a nacelle 4. A rotor 6 with three rotor blades 8 and a spinner 7 is arranged on the nacelle 4. When the wind energy installation 1 is operating, the rotor is set into rotary motion by the wind, and drives a generator (not illustrated) in the interior of the nacelle 4. The mechanical energy of the rotary motion is converted with the aid of the generator into electrical energy, and then fed into the electrical network.

The wind energy installation 1 furthermore comprises a sensor arrangement 5 for detecting at least one environmental parameter, for example wind strength, wind direction, temperature, humidity, air pressure and/or electric, magnetic and/or electromagnetic fields in the atmosphere. The sensor arrangement 5 comprises for this purpose in particular an anemometer, a temperature sensor, a humidity sensor, a barometer or pressure sensor and/or a further sensor, in particular an electric field meter for detecting electric, magnetic and/or electromagnetic fields or field strengths.

Figure 2:
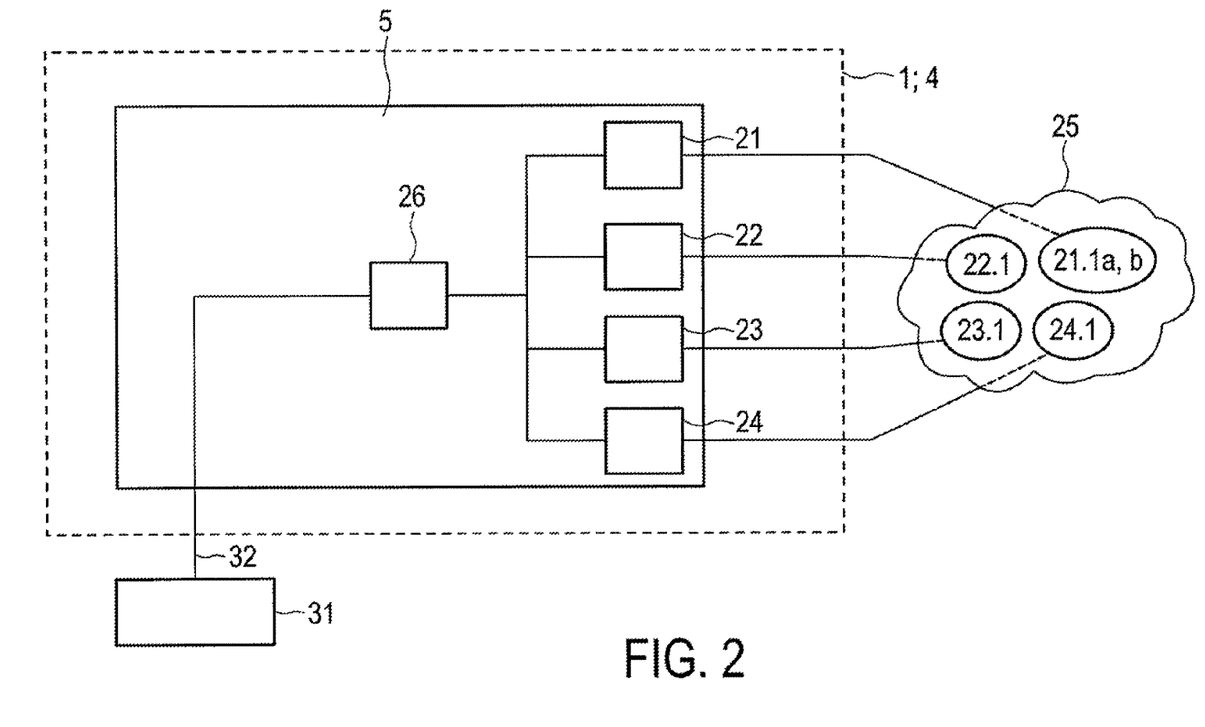
FIG. 2 shows a possible form of embodiment of a sensor arrangement.

FIG. 2 shows one possible form of embodiment of a sensor arrangement 5 for detecting environmental parameters 25, wherein the sensor arrangement 5 is arranged on a wind energy installation 1, in particular on the roof of the nacelle 4 of the wind energy installation 1 (illustrated schematically). In addition, the wind energy installation 1, in particular the sensor arrangement 5, is connected via a connecting line 32 with a server 31, in particular with a server of a wind farm, so that for example the environmental parameters 25 detected with the sensor arrangement 5 of the wind energy installation 1 can be transferred to the server 31.

The sensor arrangement 5 comprises—without restriction to the concretely named sensors—for example an anemometer 21, a temperature sensor 22, a humidity sensor 23 and/or a further sensor 24, in particular an electric field meter for detecting electric, magnetic and/or electromagnetic field strengths in the atmosphere. The sensor arrangement 5 can also comprise further sensors, for example a barometer or pressure sensor for detecting the air pressure in the atmosphere.

With the respective sensors of the sensor arrangement 5, one or more environmental parameters 25 such as wind strength 21.1a, wind direction 21.1b, temperature 22.1, air humidity 23.1 and/or electric field strength 24.1 of an electric field in the atmosphere can then be detected. In the present case the respective sensors are connected with a central control element 26 of the sensor arrangement 5, which can perform the control and/or evaluation of the individual sensors. Alternatively, however, each individual sensor may also comprise its own control unit, which is then for example integrated into the respective sensor, so that the individual sensors can also be employed "autonomously" by the sensor arrangement 5. The detected values for the environmental parameters 25 can either be evaluated in the control unit 26, which then also serves as an evaluation unit, or else in the server 31, in that they are, for example, compared with limit or reference values. If a detected value for an environmental parameter 25 exceeds a limit value, for example, a warning message, in particular a lightning warning, can be issued. Preferably the detected values for the environmental parameters 25 are passed to the server, and evaluated there centrally for multiple wind energy installations. The connecting line 32 here acts as a communication line between the wind energy installation 1 and the server 31.

Figure 3:
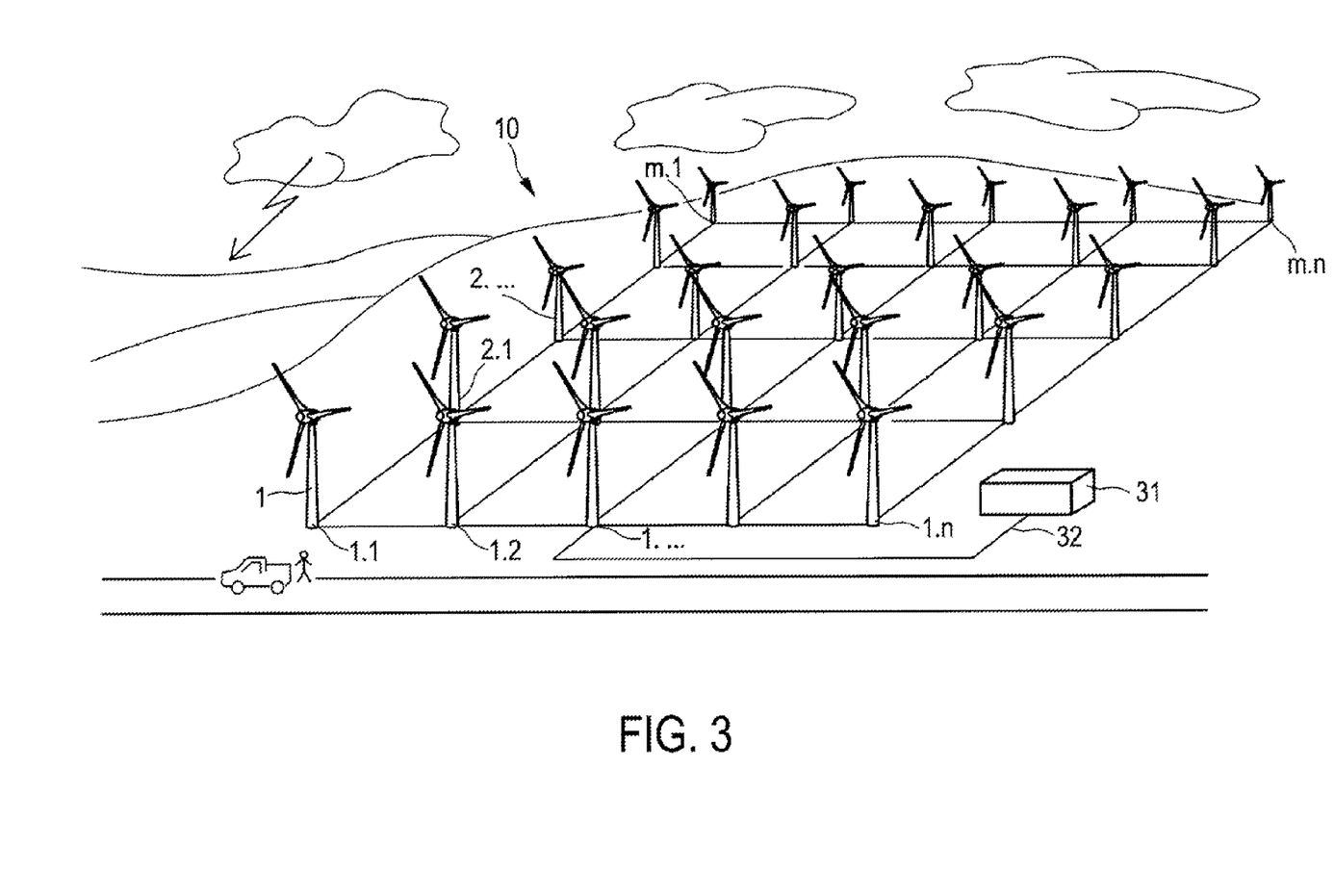
FIG. 3 shows a possible form of embodiment of a wind farm.

FIG. 3 shows one possible form of embodiment for a wind farm 10 consisting of a large number of wind energy installations 1, in particular of n*m wind energy installations 1, where the individual wind energy installations 1 are each arranged at a particular location 1.1, 1.2, . . . , m.n. The locations can, for example, be the coordinates of any appropriate coordinate system for the wind energy installations, or however can also be individual (serial) numbers which then are each assigned to a particular wind energy installation 1. Alternatively or in addition the locations may also contain GPS information relating to the actual location of the particular wind energy installation 1.

In the present case each of the large number of wind energy installations 1 comprises a sensor arrangement, as is for example illustrated and described in FIG. 2, and with which environmental parameters such as wind strength, wind direction, temperature, air pressure, air humidity and/or an electromagnetic field can be detected.

A server 31 is moreover provided, which is connected via a connecting line 32 with the individual wind energy installations 1 of the large number of wind energy installations, so that the environmental parameters detected with a specific wind energy installation 1, in particular the sensor arrangement of the specific wind energy installation 1, can be passed on to the server 31. Each wind energy installation 1 here transmits, along with the detected environmental parameters, also information about its location 1.1, 1.2, . . . , m.n to the server 31, so that a precise association is possible in the server between the detected environmental parameters and a specific wind energy installation.

Figure 4:
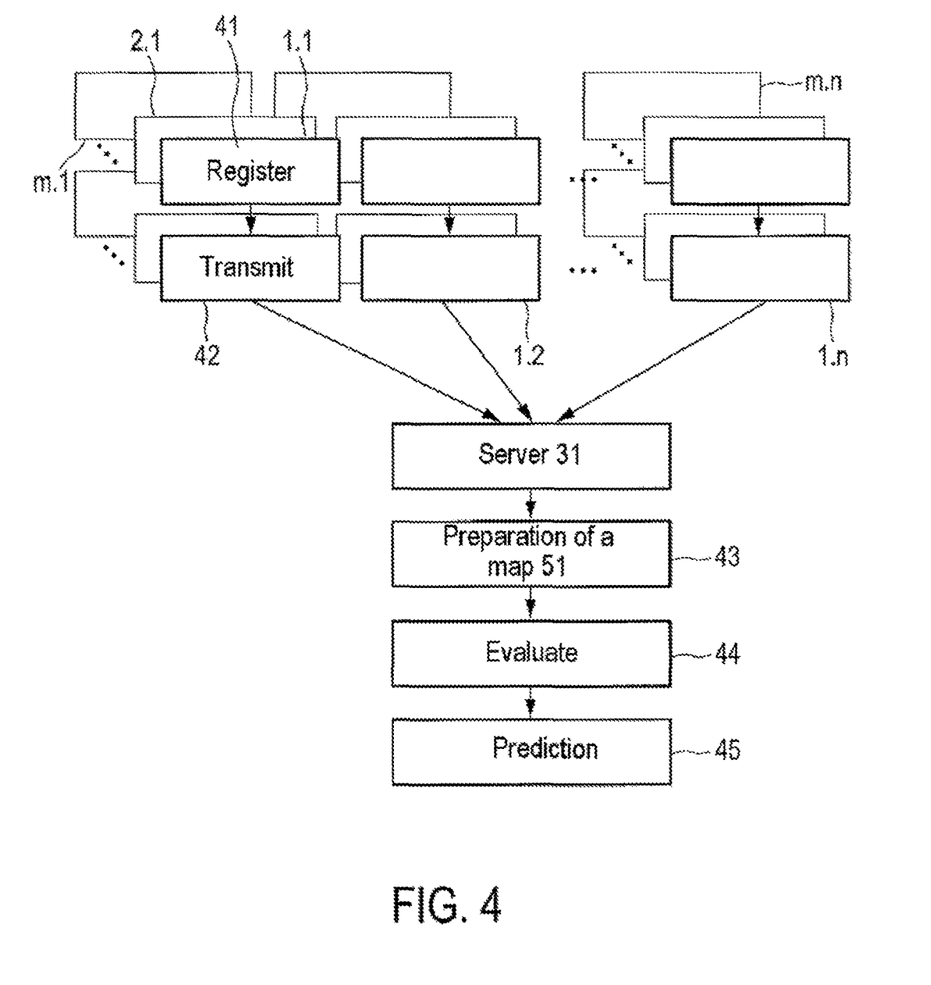
FIG. 4 shows a possible form of embodiment for a method for warning of thunderstorms, in particular a lightning warning, with a large number of wind energy installations.

FIG. 4 shows a schematic illustration of a possible form of embodiment of a method for lightning warning with a large number of wind energy installations.

Here, one or more environmental parameters, in particular wind strength, wind direction, temperature, air pressure, air humidity and/or an electric field are detected 41, for example with a large number of wind energy installations, in particular with the wind energy installations of a wind farm with n*m wind energy installations, namely a wind energy installation at location 1.1, a wind energy installation at location 1.2, a wind energy installation at location 1.3, and so on, and finally with a wind energy installation at location m.n, and are then transmitted 42 or passed on from the respective wind energy installations to a server 31, in particular to a server of the wind farm. The individual wind energy installations with their sensor arrangements at their respective locations 1.1 to m.n here act as (weather) measuring stations for the various environmental parameters, such as wind strength, wind direction, temperature, air humidity, air pressure and/or electric fields in the atmosphere.

In the server 31 the detected environmental parameters are then used, together with the locations, to prepare 43 one or more map(s) 51 in which the detected values are mapped, i.e., displayed graphically. Without restriction of the present invention, various methods of representation can be used here in order to visually represent the detected data. It can also be provided that a graphical representation is entirely omitted for the evaluation 44 of the detected environmental parameters, wherein then only the numerical values, for example in the form of tables and/or other data records for the environmental parameters, are evaluated.

Preferably a map for the locations of the large number of wind energy installations and for one or more detected values of environmental parameters is prepared 43 and evaluated 44 for the prediction 45 of a lightning warning for one or more locations of the large number of wind energy installations.

For the evaluation 44 of the detected environmental parameters, these detected values can, for example, be evaluated with the help of standard models, such as are known for weather research and weather prediction. On this basis an evaluation result for the prediction, in particular for a lightning strike and a lightning warning, can then be determined and output.

Figure 5:
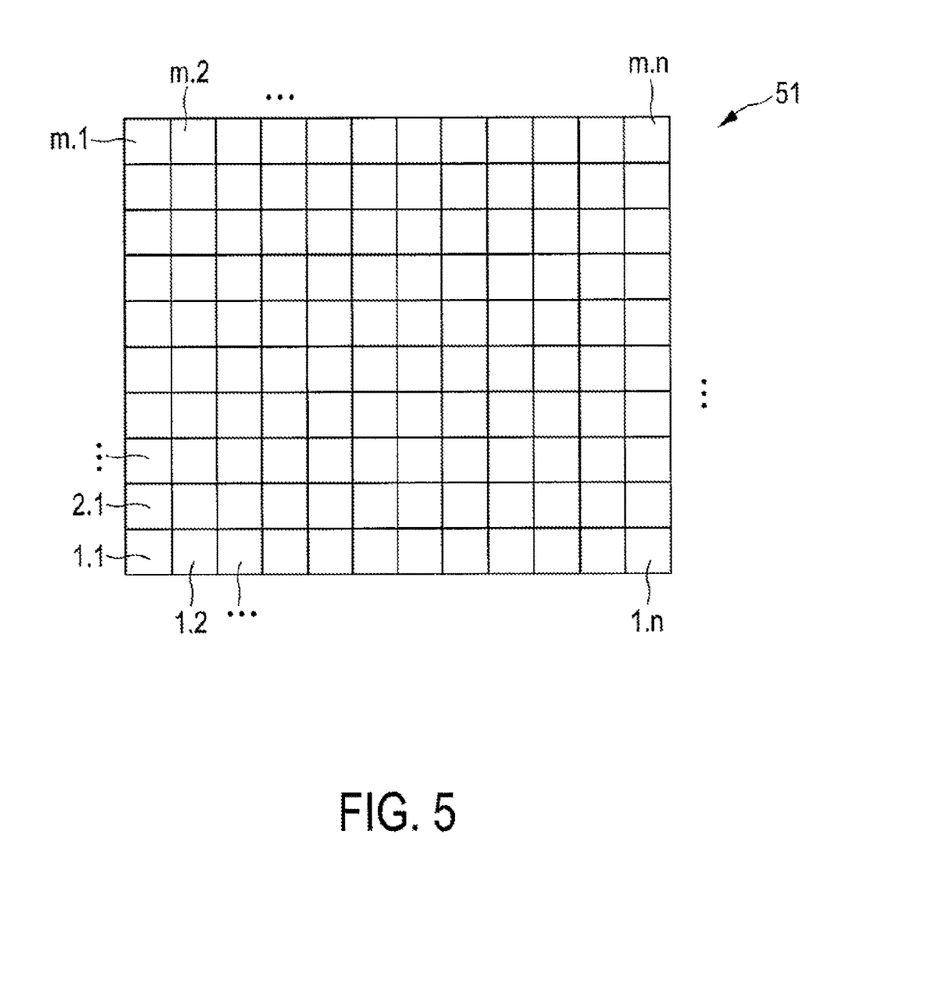
FIG. 5 shows a possible form of embodiment of a map for the locations of the large number of wind energy installations, and a value for an environmental parameter.

FIG. 5 shows one possible form of embodiment of a map for the locations 1.1 to m.n of the large number of wind energy installations. In the present case, the map comprises n*m pixels, that is m rows and n columns, wherein each pixel can be assigned a particular wind energy installation, in particular the location of a specific wind energy installation, of the wind farm. Each pixel of the map 51 thus always comprises at least two items of information, namely firstly a value for an environmental parameter, for example wind strength, wind direction, temperature, air humidity, air pressure and/or electric field strength, and secondly information about the location of the wind energy installation, for example GPS information or similar, with which wind energy installation the respective environmental parameter (of the pixel of the map) was detected. Without restriction, maps with other forms of embodiment can also be prepared, which are then appropriately configured to represent correctly the location information of the wind energy installation of the wind farm. For example, pixels of different sizes and/or pixel shapes can be provided. The maps are appropriately adjusted depending on the way in which the wind energy installations are distributed or arranged in the wind farm, or on what the actual shape of the wind farm is. In the present case—but without restricting the invention to this concrete embodiment—the map belongs to a rectangular wind farm with n*m wind energy installations, as for example is illustrated and described in FIG. 3.

Figure 6:
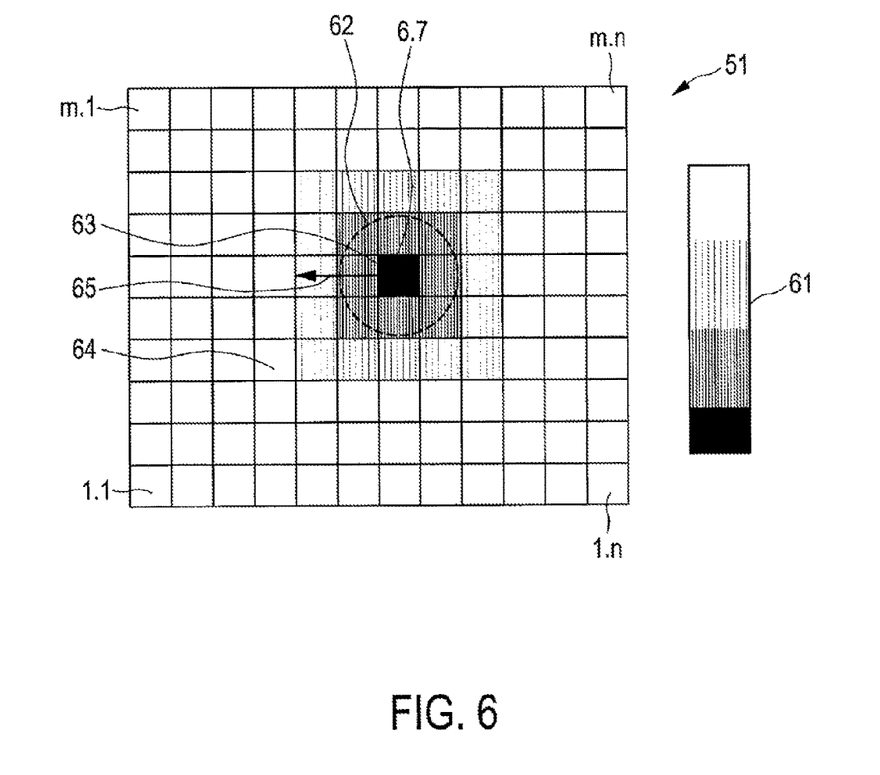
FIG. 6 shows a further form of embodiment of a map for the locations of the large number of wind energy installations, and the strength of an electromagnetic field as the detected environmental parameter.

FIG. 6 shows one possible form of embodiment of a prepared map—as is described in FIG. 5—for the locations of the large number of wind energy installations and the (field) strength of an electric field as the registered environmental parameter. In the present case the strength of the electric field is illustrated in the form of a color scale 61 from black to white, wherein black represents a strong electric field and white represents a weak electric field. Other color scales and/or other scale forms that are configured to represent different field strengths graphically can also be used without restriction. The scales, or the graphic representation, can here for example also be chosen as either relative (to a maximum 63 or minimum value 64) or absolute. A logarithmic representation can also be provided. In the present case the white pixels represent the minimum value 64 and the black pixel(s) represent the maximum value(s) for the strength of the electric field. It is also for example possible to determine a gradient 65, as a direction index for the steepest rise, for the electric field and to display it (arrow).

In the present case a distribution of the field strength for an electric field for the individual wind energy installations/locations of wind farm is illustrated, wherein the values for the strength of the electric field are detected with the aid of the respective sensor arrangement for the individual wind energy installations, and are passed on to a server. From the detected environmental parameters, the field strength in the present case, together with the locations, a map 51 is then prepared in the server on which the registered values are mapped, i.e., displayed graphically. The detected distribution of the electric field strength illustrated has a maximum value of 63 at/in pixel 6.7. The electric field is accordingly the strongest at the wind energy installation at location 6.7. The probability of an atmospheric discharge in the form of a lightning strike is at its greatest here.

If the electric field strength exceeds a specific limit value, for example 150 kV/m, and thus a specific limit probability for a lightning strike, it is assumed that a lightning strike is possible at this wind energy installation, and a lightning warning is issued to the corresponding wind energy installation. It can also be provided that a lightning warning is issued to multiple wind energy installations in a specific area 62 around the corresponding wind energy installation, in particular to neighboring wind energy installations.

Figure 7:
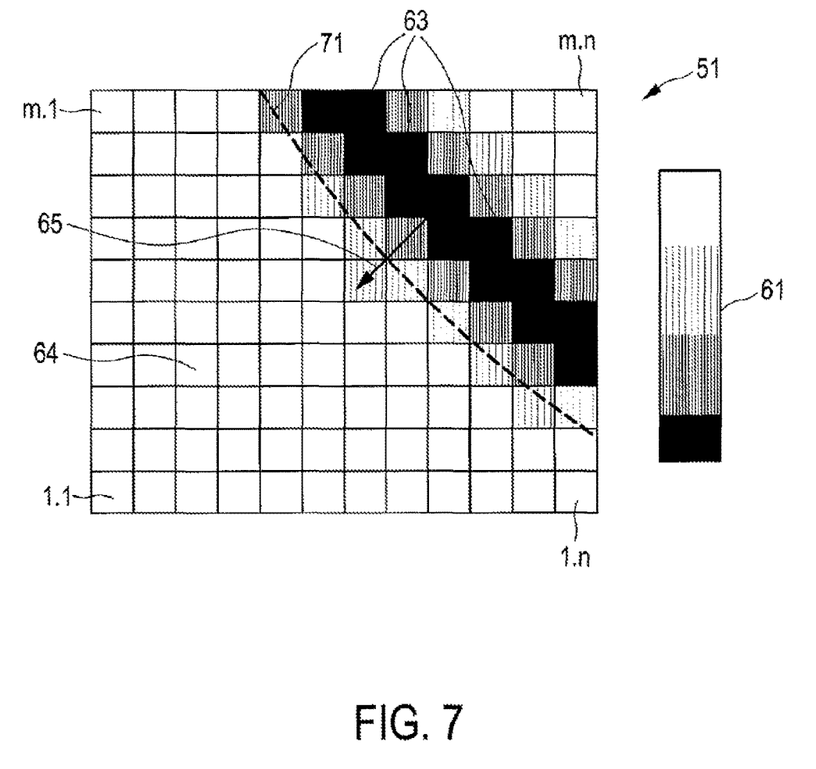
FIG. 7 shows another form of embodiment of a map for the locations of the large number of wind energy installations, and the wind strength as the detected environmental parameter.

FIG. 7 shows a further form of embodiment of a prepared map—as is described in FIG. 5—for the locations 1.1 to m.n of the large number of wind energy installations of a wind farm, and of the wind strength as the detected environmental parameter. Similarly to FIG. 6, in the present case the strength of the wind is represented in the form of a color scale, wherein high wind strengths or high wind speeds are identified with black, and low wind strengths with white. In the map 51 shown here, a distribution of wind strengths can be recognized that features multiple maximum values 63 in the form of an elongated maximum. This is a wind front 71 moving over the wind farm.

Figure 8:
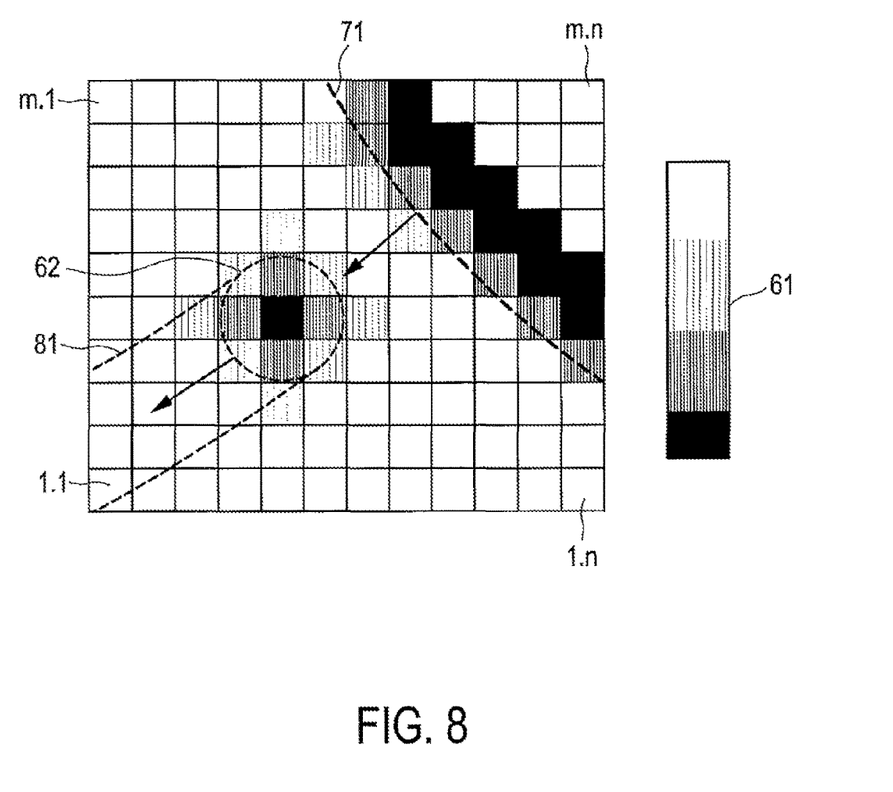
FIG. 8 again shows another form of embodiment of a map for the locations of the large number of wind energy installations, and a combination of field strength and wind strength as the detected environmental parameter.

FIG. 8 shows a further form of embodiment for a map 51, wherein two detected environmental parameters, namely the electric field strength and the wind strength, as are for example illustrated and described in FIGS. 6 and 7, are shown together in one map.

In the present case a wind front 71, which is driving in front of it an electric field distribution, in particular the clouds with the charge separations, is shown. From the combined representation of the electric field and wind strength, it is possible for example to determine a lightning strike prediction for a specific area 62, and a development 81 over time of the area 62, in which the wind energy installations are stationed, in which a lightning strike is feared, so that a lightning warning can be issued to these—potentially at-risk—wind energy installations.

Figure 9:
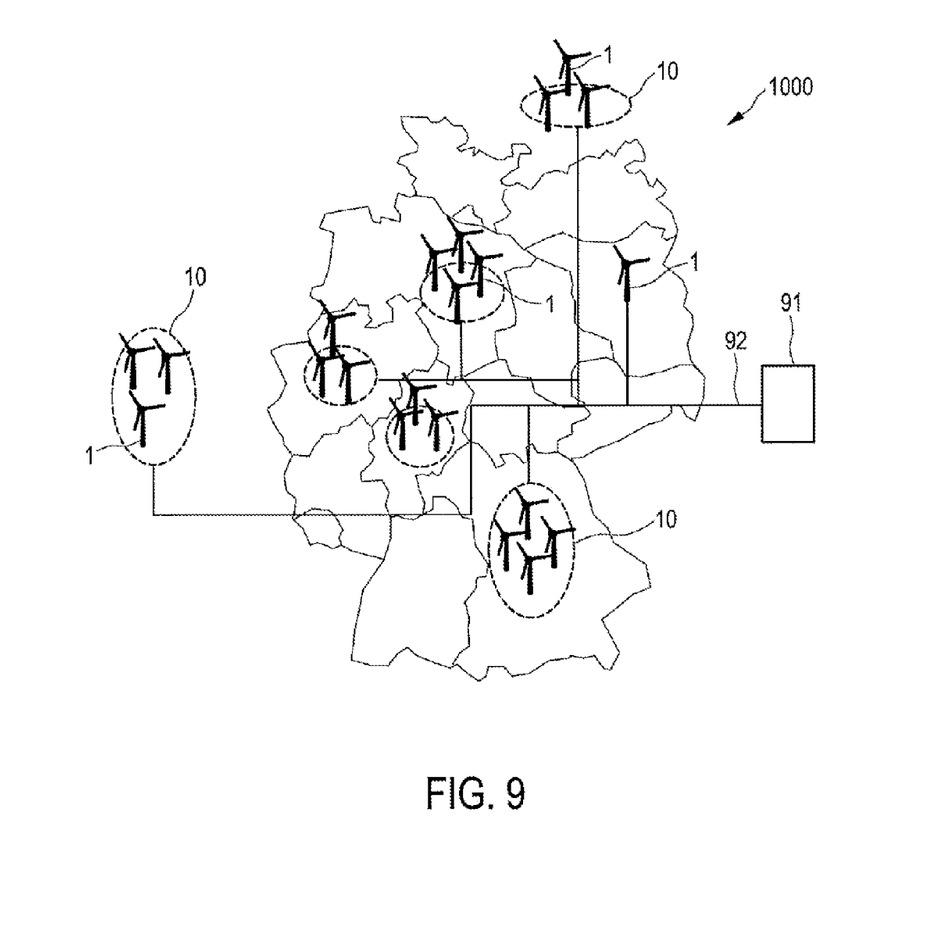
FIG. 9 shows a possible form of embodiment for a system for weather prediction, in particular for lightning warning.

FIG. 9 shows a possible form of embodiment for a system 1000 for weather prediction, in particular for lightning warning. Many different wind farm installations, including for example offshore wind farms, or individual wind energy installations, can here be networked over a connecting network 92 and connected with a common, central server 91. It is also conceivable that the servers of individual wind farms (cf., e.g., server 31 in FIG. 3) are connected with the common, central server 91. With the respective wind farms and/or wind energy installations, environmental parameters over a large area at different locations can then be detected and passed to the central server 91. In the common, central server 91, the detected environmental parameters can then be evaluated for weather prediction, in particular for thunderstorm and/or lightning warning.

The invention claimed is:

1. A method for predicting lightning in an area of a plurality of wind energy installations, wherein the plurality of wind energy installations are coupled to a server, wherein each of the wind energy installations are located at a respective location, and each of the plurality of wind energy installations comprises a sensor arrangement for detecting an environmental parameter, the sensor arrangement including at least one of an anemometer, a temperature sensor and a humidity sensor, and further including an electric field meter for detecting electric fields, and the method comprises:

for each of the sensor arrangements of the plurality of wind energy installations, detecting at least one value of an environmental parameter indicative of an electric field in the respective location;

transmitting the at least one value of the environmental parameter from the respective wind energy installations to the server;

determining a probability of lightning to strike by comparing each of the at least one value of the environmental parameters, wherein determining includes:

preparing a plurality of maps that includes the respective at least one value of the environmental parameter and combining the plurality of maps into a combined single map; and evaluating the combined single map and identifying lightning warning predications based on probabilities for lightning to strike at respective locations of the wind energy installations; and issuing of a lightning warning for one or more locations, when the evaluation determines a probability for lightning to strike is above a threshold level.

2. The method according to claim 1, wherein the at least one value of the environmental parameter is one or more of the following: electric field strength, magnetic field strength, and electromagnetic field strength.

3. The method according to claim 1, wherein the at least one value of the environmental parameter is compared with a reference value.

4. The method according to claim 1, wherein evaluating the map further includes determining at least one of a minimum value, a maximum value and a gradient.

5. The method according to claim 1, wherein the probabilities for lightning to strike are compared with limiting probabilities, and a lightning warning is issued for the locations of the plurality of wind energy installations at which the probability for lightning to strike exceeds the limiting probability.

6. The method according to claim 1, wherein the lightning warning includes at least one of an audible announcement and a warning light.

7. A plurality of wind energy installations and a server configured to carry out the method according to claim 1, wherein:

each of the plurality of wind energy installations comprise a sensor arrangement configured to detect one or more environmental parameters, the sensor arrangement comprising at least one of an anemometer, a temperature sensor, and a humidity sensor, and further comprising an electric field meter, wherein the one or more environmental parameters includes a value corresponding an electric field detected; and the server includes software configured to evaluate the one or more environmental parameters, predict the probability of lightning to strike, and issue a lightning warning.

8. The plurality of wind energy installations according to claim 7, wherein each of the plurality of wind energy installations further comprise a nacelle, wherein the sensor arrangement is on a roof of the nacelle.

9. The plurality of wind energy installations according to claim 7, wherein the plurality of wind energy installations form a wind farm.

* * * * *